United States Patent
Hau-Riege et al.

(10) Patent No.: US 6,822,473 B1
(45) Date of Patent: Nov. 23, 2004

(54) DETERMINATION OF PERMEABILITY OF LAYER MATERIAL WITHIN INTERCONNECT

(75) Inventors: Christine Hau-Riege, Fremont, CA (US); Stefan Hau-Riege, Fremont, CA (US); Amit P. Marathe, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 221 days.

(21) Appl. No.: 10/283,447

(22) Filed: Oct. 30, 2002

Related U.S. Application Data

(63) Continuation-in-part of application No. 10/179,163, filed on Jun. 25, 2002.

(51) Int. Cl.$^7$ .............................................. S01R 27/26
(52) U.S. Cl. ................................... 324/766; 324/158.1
(58) Field of Search ............................. 324/537, 158.1, 324/766, 716, 719, 73.1, 765, 769; 257/734, 758, 773, 767, 40, 48; 438/14, 18

(56) References Cited

U.S. PATENT DOCUMENTS

| | | | | |
|---|---|---|---|---|
| 5,786,705 A | * | 7/1998 | Bui et al. ................... | 324/766 |
| 5,900,735 A | * | 5/1999 | Yamamoto ................. | 324/537 |
| 6,388,269 B1 | * | 5/2002 | Saito .......................... | 257/48 |

OTHER PUBLICATIONS

I.A. Blech and Conyers Herring, *Stress Generation by Electromigration*, Applied Physics Letters, vol. 29, No. 3, Aug. 1976, pp. 131–133.

K. Ueno et al., *A High Reliability Copper Dual–Damascene Interconnection with Direct–Contact Via Structure*, IEDM, 2000, 265–268.

S.P. Riege et al., *A Hierarchical Reliability Analysis for Circuit Design Evaluation*, IEEE Transactions on Electron Devices, vol. 45, No. 10, Oct. 1998, pp. 2254–2257.

Young Joon Park and Carl V. Thompson, *The Effects of the Stress Dependence of Atomic Diffusivity on Stress Evolution due to Electromigration*, J. Appl. Phys., vol. 82, No. 9, Nov. 1997, pp. 4277–4281.

C.S. Hau–Riege and Carl V. Thompson, *The Effects of Microstructural Transitions at Width Transitions on Interconnect Reliability*, J. Appl. Phys., vol. 82, No. 12, Jun. 12, 2000, pp. 8467–8472.

* cited by examiner

*Primary Examiner*—Evan Pert
*Assistant Examiner*—Jimmy Nguyen
(74) *Attorney, Agent, or Firm*—Monica H. Choi

(57) ABSTRACT

Electromigration permeability is determined for a layer material within an interconnect test structure comprised of a feeder line, a test line, and a supply line. A no-flux structure is disposed between the feeder line and the test line, and the layer material is disposed between the test line and the supply line. A respective current density and length product for each of the test line and the supply line is less than a critical Blech length constant, $(J*L)_{CRIT}$. A net current density and length product $(J*L)_{NET}$ for the test line and the supply line is greater than the $(J*L)_{CRIT}$. The electromigration permeability of the layer material is determined from an electromigration lifetime of the interconnect test structure with current flowing therein.

25 Claims, 12 Drawing Sheets

DETERMINATION OF PERMEABILITY OF LAYER MATERIAL WITHIN INTERCONNECT

This is a CIP (continuation-in-part) of an earlier filed copending patent application, with Ser. No. 10/179,163 filed on Jun. 25, 2002, for which priority is claimed. This earlier filed copending patent application with Ser. No. 10/179,163 is in its entirety incorporated herewith by reference.

FIELD OF INVENTION

The present invention relates generally to test methods used in integrated circuit manufacturing. More particularly, the present invention relates to test methods for determining a value of barrier permeability associated with a test barrier at a via bottom based on a measured lifetime of a test structure containing the test barrier.

BACKGROUND OF THE INVENTION

As interconnect dimensions scale to smaller sizes and current densities increase in today's integrated circuits, the reliability of interconnects becomes a greater concern due to increased electromigration rates. Electromigration (EM), which is the diffusion of atoms in an interconnect induced by an electric current, can lead to interconnect failure by voiding or extrusion at sites of atomic flux divergence, that is, where the net flux of atoms is not zero. The net displacement of atoms during EM causes local stress changes in the interconnect in which either tensile or compressive stresses develop as atoms are depleted or accumulated, respectively. Tensile and compressive stresses can develop, for example, at the electron-source (cathode) and the electron-sink (anode) vias, respectively, when the vias are no-flux boundaries, such as W- or Ti-filled vias. Failure of the interconnect will occur, for example, once the stress somewhere in the line exceeds a critical stress required for void nucleation.

One of the purposes of a barrier layer is to prevent mass flow (diffusion of atoms) between the metal layers and the resultant interconnect failures due to electromigration. As device sizes continue to shrink, barrier materials must become thinner in order to minimize resistance at the vias. However, the thinning of the barrier may cause the interface of the via/feeder-line to become permeable to mass flux and lead to EM failures.

FIG. 1A illustrates a cross-sectional view of a two metal layer interconnect structure 100 having a first conductor 105, a second conductor 110, a third conductor 115, respectively. A barrier layer 120 is disposed between the first conductor 105 and the second conductor 110 at a cathode via 125 and disposed between the second conductor 110 and the third conductor 115 at an anode via 130. The second conductor 110, having a length L 135, forms an interconnect between the first and third conductors. Length L 135, is measured from the via at one end of the interconnect line to the via at the other end. FIG. 1A also illustrates the tensile stresses 140 which can develop in the region of the cathode via 125, and the compressive forces 145 which can develop in the region of the anode via 130 as electrons flow from the cathode to the anode. Typically, the layers may be formed, for example, using conductors of Al, Al alloy, with a TiN barrier layer, or using Cu conductors, with a TaN barrier layer.

FIG. 1B shows a cross-sectional view of another two metal layer interconnect structure 150 similar to the structure 100 illustrated in FIG. 1A. FIG. 1B illustrates a common failure mode due to voids 160 which typically form in areas of the highest tensile stresses (e.g., 140 of FIG. 1A), near the region of the cathode via 125. Mass flux-divergence taking place at the electron-source (cathode) vias, produces maximum tensile stresses in this region. When these tensile forces reach a critical stress level, void nucleation occurs. Eventually, if a high enough current density is maintained through the interconnect, failure of the interconnect may result due to electromigration (EM failure).

FIGS. 1A and 1B also illustrate the conventional EM test structures which attempt to determine the lifetime of such structures, to analyze the effects of EM on various structures, or the effect of a barrier layer on EM. In the conventional method, current is conducted from the cathode conductor to the anode conductor until the resistance of the test structure reaches a predetermined failure criterion. Conventional methods measure the lifetime of the test structure, or may even indicate improved or worsened lifetimes, but do not quantify a specific barrier parameter associated with the structure's lifetime.

In addition, conventional two-level EM test structures often have feeder lines that are much wider than the test line and therefore are insensitive to the permeability of the barrier at the via since mass flow from the feeder line to the via is negligible when compared to the volume of the feeder line.

Currently, some conventional EM test structures rely on an assumption that a barrier layer being tested has no mass flux entering from the cathode/feeder line, but may in fact, have a mass flux which may reduce or invalidate the effectiveness of testing lifetime measurements associated with specific parameters of the barrier which are under investigation.

Accordingly, there is a need for quantifying a specific barrier layer parameter associated with the lifetime of a test structure during electromigration in a test structure.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a method of determining a barrier permeability, wherein a barrier permeability value is assigned to a test barrier based on a measured lifetime of a test structure used in integrated circuit manufacturing.

In the present invention a new EM test structure is also proposed in order to not only detect the permeability of a barrier/via, but also to allow for the quantifying of the degree of permeability, herein symbolized as (α). According to one aspect of the invention, this may be accomplished using experimental lifetimes from different barrier permeability structures and by EM simulation.

In one aspect of the present invention, an interconnect test structure is formed for determining a magnitude of electromigration permeability of a layer material within an interconnect. The interconnect test structure includes a test line comprised of a conductive material and having a first current density, $J_1$, and a first length, $L_1$. The interconnect test structure also includes a feeder line comprised of a conductive material and coupled to the test line, and the feeder line is a source of electrons flowing into the test line. Furthermore, the interconnect test structure includes a supply line comprised of a conductive material and coupled to the test line and having a second current density, $J_2$, and a second length, $L_2$, and the supply line is a sink of electrons flowing from the test line. In addition, a no-flux structure is disposed between the feeder line and the test line, and the layer material is disposed between the test line and the supply line.

Additionally, a product of the first current density and the first length of the test line, $J_1*L_1$, is less than a critical Blech length constant, $(J*L)_{CRIT}$, and a product of the second current density and the second length of the supply line, $J_2*L_2$, is less than the critical Blech length constant, $(J*L)_{CRIT}$, to ensure that the test line and the supply line are individually immortal such that electromigration failure of the interconnect test structure is attributable to permeability of the layer material. On the other hand, a net current density and length product $(J*L)_{NET}$ for the test line and the supply line is greater than the critical Blech length constant, $(J*L)_{CRIT}$, to ensure that the interconnect test structure exhibits electromigration failure from permeability of the layer material.

In another aspect of the present invention, in a system and method for determining the magnitude of electromigration permeability of the layer material within the test interconnect structure, a current source is operable to conduct current through the interconnect test structure with electrons flowing from the feeder line through the test line to the supply line. Furthermore, a timer is operable to measure an electromigration lifetime of the interconnect test structure, and a processor determines the magnitude of electromigration permeability of the layer material from the measured electromigration lifetime of the interconnect test structure.

The aspects of the invention find application in devices which include semiconductors, integrated circuits, and the manufacturing of such devices.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The figures referred to herein are drawn for clarity of illustration and are not necessarily drawn to scale. Elements having the same reference number in FIGS. 1A, 1B, 2, 3, 4, 5, 6, 7, 8A, 8B, 9, 10, 11, 12, 13, and 14 refer to elements having similar structure and function.

DETAILED DESCRIPTION OF THE INVENTION

Figure 1A:
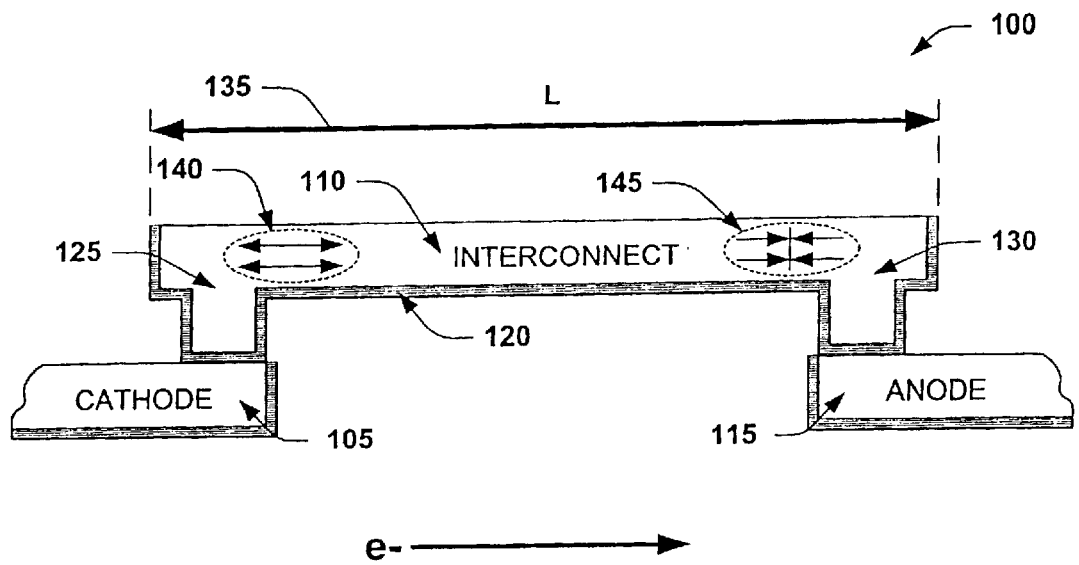
FIG. 1A is a cross-sectional view of a conventional metal interconnect of a conventional test structure, illustrating tensile and compressive stresses produced near vias during electromigration.
Figure 1B:
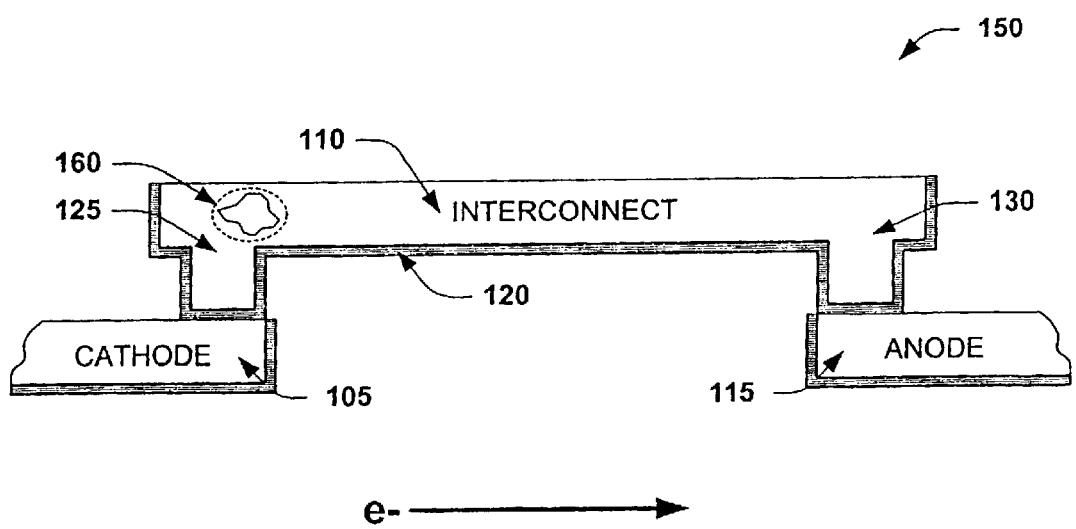
FIG. 1B is a cross-sectional view of a conventional metal interconnect of a conventional test structure, illustrating mass flux induced voiding produced by tensile stresses at the cathode via during electromigration.

The present invention will now be described with reference to the drawings, wherein like reference numerals are used to refer to like elements throughout. The present invention relates to a test method and system used in integrated circuit manufacturing for determining the value of barrier permeability associated with a test barrier at a via bottom based on a measured lifetime of a test structure containing the test barrier. The method provides a test structure having a test barrier which is tested, and a magnitude value is assigned thereto which reflects a degree of barrier permeability (herein symbolized as ($\alpha$)) at the via/supply-line barrier interface. A test structure is formed having a test barrier disposed between a first and second conductor, thru which a current is passed in order to measure a lifetime of the test structure. The measured lifetime of the test structure is then used to determine and assign a value (e.g., the magnitude) of the permeability of the test barrier.

Current test methods and EM test structures may seek to determine the lifetime of such structures, to analyze the effects of EM on various structures and the effect of a barrier layer on EM, or may even indicate improved or worsened lifetimes, but do not attempt to actually quantify the permeability of a barrier layer associated with the lifetime of the structure.

The present invention seeks to define a measurement of permeability, as stated above for $\alpha$, to provide a test structure which enables a measurement of the permeability of a test barrier (layer) during EM while eliminating the effects of mass flux from the cathode feeder-line, and to provide a testing methodology for assigning a permeability value to the test barrier within the test structure based on the measured lifetime of the structure.

Figure 2:
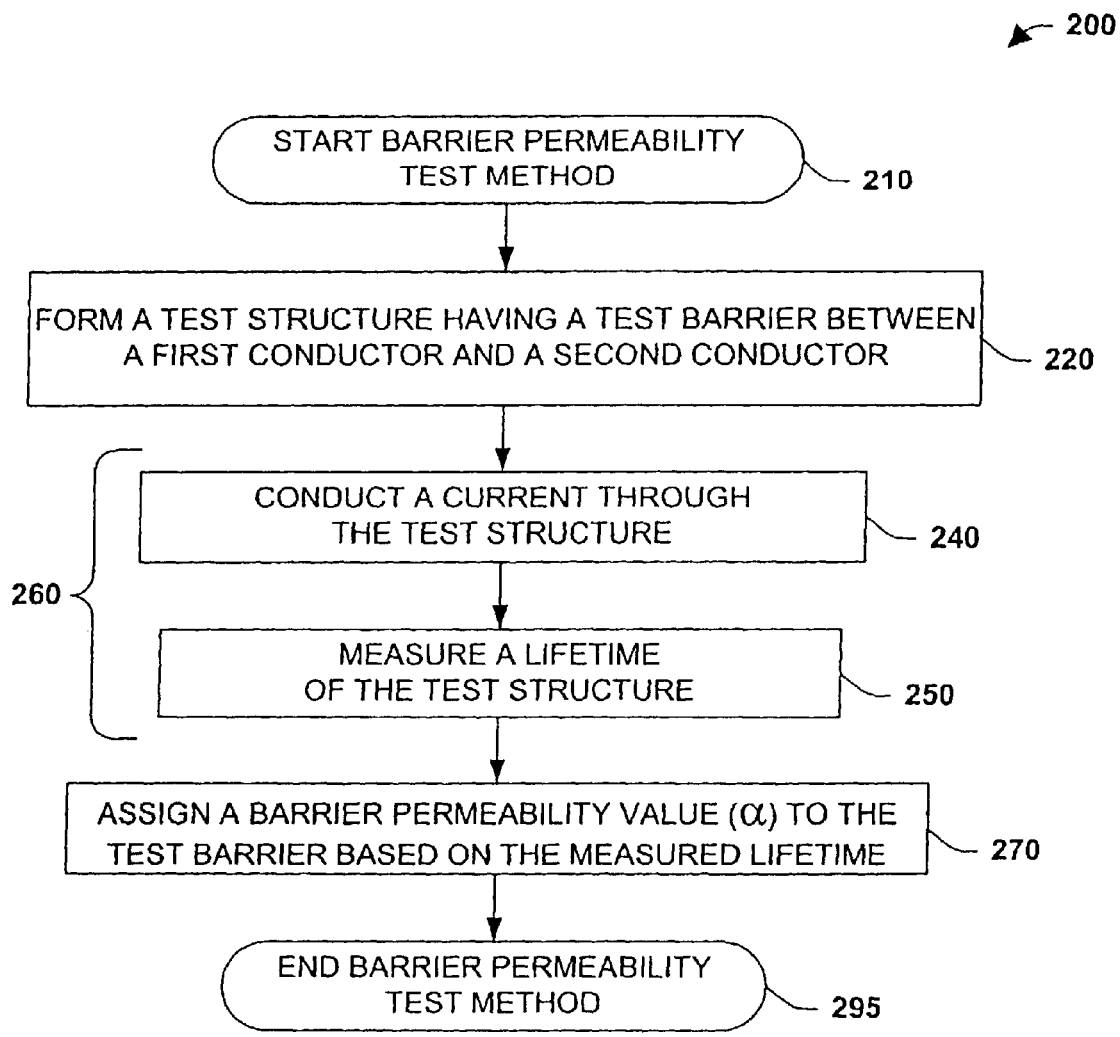
FIG. 2 is a flow diagram illustrating an exemplary method for ascertaining a barrier permeability in association with an aspect of the present invention.

An aspect of the present invention provides a methodology for determining a magnitude of permeability of a barrier in an integrated circuit device, which may be employed in association with the test structures illustrated and described herein, as well as with other test structures. Referring to FIG. 2, an exemplary test method 200 is illustrated in association with an aspect of the present invention. While the exemplary method 200 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 200 may be implemented in association with the apparatus and systems illustrated and described herein as well as in association with other systems not illustrated.

The method 200 comprises forming a test structure having a test barrier between two conductors at a via, conducting a current through the test structure, measuring a time to failure (lifetime) of the test structure. A barrier permeability value is then assigned to the test barrier of the test structure, based on the measured lifetime.

The barrier permeability test method begins at 210. At 220 a test structure is formed having a test barrier between a first conductor and a second conductor at a via. At 240, a current (e.g. a substantially constant current from a constant current source) is conducted through the test structure, wherein electrons flow from the first conductor through the test barrier and into the second conductor. The lifetime of the test structure is measured at 250, for example, by identifying a time period at which a predetermined change of resistance from an initial value of the test structure occurs.

Figure 3:
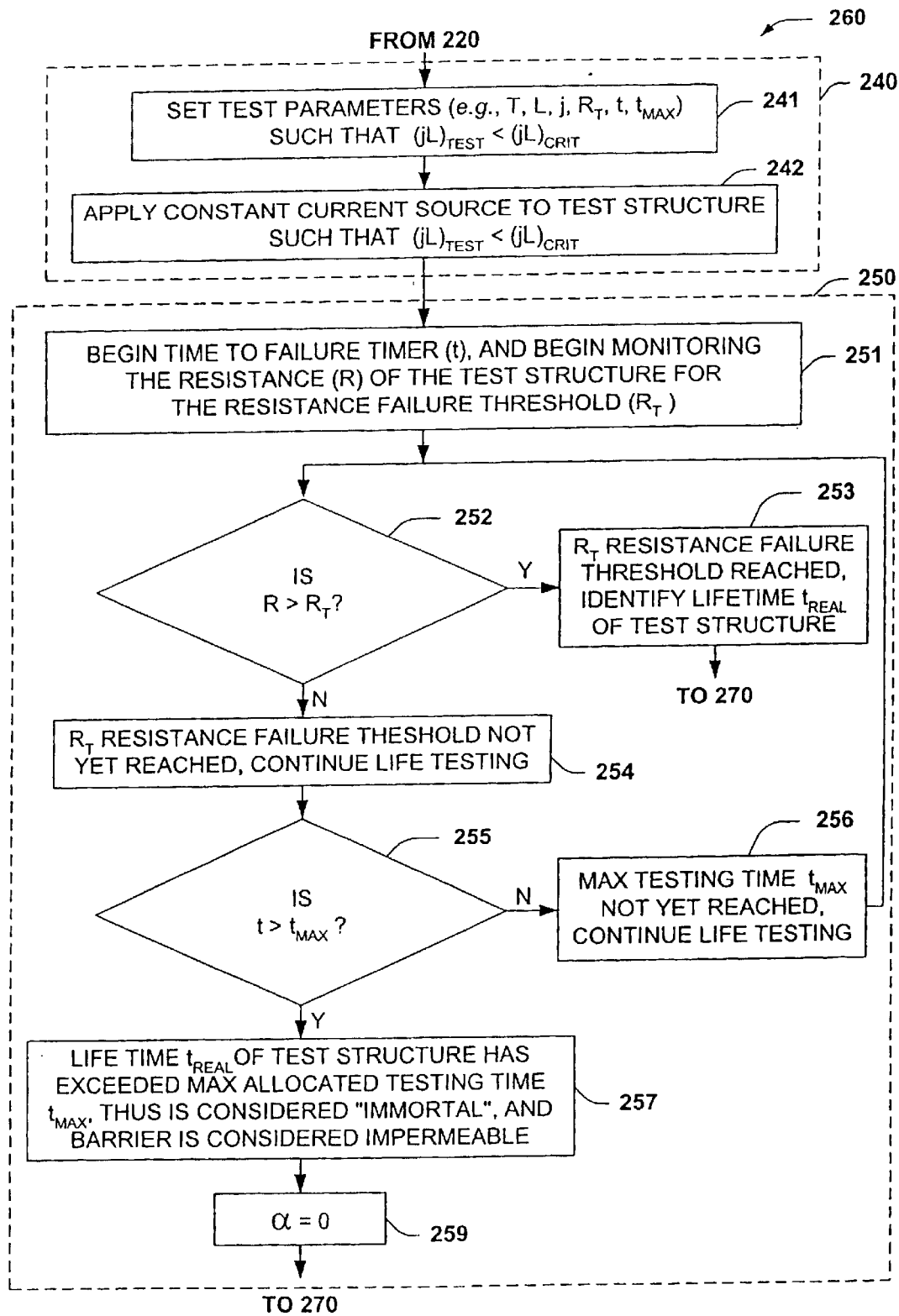
FIG. 3 is a flow diagram illustrating further details of the exemplary barrier permeability test method of FIG. 2 in association with an aspect of the present invention.

For example, FIG. 3 is a flow diagram 260 which further details 240 and 250 of the exemplary barrier permeability test method of FIG. 2 in association with an aspect of the present invention. Referring to FIG. 3, flow diagram 260 details in 240 the setting of several basic test parameters, whereby the current conduction may be established and the test structure may be life tested. For example, at 241, the temperature T of the test is established and set to a stable value which may be an elevated temperature for an accelerated life test.

A test product $(jL)_{TEST}$ of the length L of an interconnect (test line) within the test structure along with the current density j flowing through the interconnect may also be established at 241 such that the product of the two variables remains below a critical product $(jL)_{CRIT}$. The critical product $(jL)_{CRIT}$ in one example is defined as the critical Blech length, wherein the product of the two variables provides a balance between an electron wind force and a back stress force, ensuring that the interconnect will be substantially immortal to EM failure. The point here is, a test product $(jL)_{TEST}$ less than the critical product $(jL)_{CRIT}$ will thus, also be substantially immortal to EM failure.

Also, at 241 a predetermined resistance threshold $R_T$ may be established at which point the resistance R of the test structure will have changed by a predetermined percentage from an initial resistance (e.g., $R_T = R_{INITIAL} + \Delta R$). 241 also establishes a time t which will be measured for a time to failure of the test structure which is the measured lifetime $t_{REAL}$, or until a predetermined maximum allowable testing time $t_{MAX}$ has been reached. At 242, the substantially constant current is applied to the test structure such that $(jL)_{TEST} < (jL)_{CRIT}$.

The lifetime of the test structure is measured at 250, and proceeds at 251, wherein a time to failure timer t is begun, while the resistance R of the test structure is monitored for the predetermined resistance failure threshold $R_T$. At 252 a determination is made whether the resistance R of the test structure has reached the predetermined failure threshold $R_T$. If the resistance of the test structure has reached $R_T$, then the measured lifetime of the test structure is identified as $t_{REAL}$ at 253, and the test method proceeds back to 270 of FIG. 2.

Otherwise, if the resistance of the test structure has not reached $R_T$, then the lifetime of the test structure has also not been reached, as identified by 254, and testing continues to 255 of FIG. 3. At 255 a determination is made whether the time t of the testing has reached the predetermined maximum allowable testing time $t_{MAX}$. If the maximum allowable testing time $t_{MAX}$ has been reached while the resistance is still less than $R_T$, then the measured lifetime of the test structure is identified as $t_{MAX}$ at 257 and is therefore considered substantially immortal to EM failure. As the test structure is considered substantially immortal to EM failure, the permeability of the test barrier is considered impermeable and is identified as $\alpha = 0$ at 259, and the test method proceeds back to 270 of FIG. 2.

Otherwise, if the maximum allowable testing time $t_{MAX}$ has not been reached, while the resistance is still less than $R_T$, then the lifetime testing continues to 256, which then continues back to the resistance determination at 252 of FIG. 3.

Thereafter, referring back to FIG. 2, a barrier permeability value $\alpha$ is assigned to the test barrier of a test structure at 270 based on the measured lifetime of the test structure. In one example, the barrier permeability value a represents the fraction of the atomic flux associated with the test barrier compared to a completely permeable boundary, which may be used for various barrier evaluations and integrated circuit manufacturing operations. The operation thereafter ends at 295, and the method 200 may be repeated for subsequent barrier permeability tests of additional test structures.

Optionally, the method 200 may be expanded to include the use of a processor or computer type simulator, for example, to supply simulation lifetime data which is generally associated with the test structure. The simulation lifetime data may be, for example, in the form of a plot, or look-up table correlating a simulated lifetime $t_{SIM}$ to a simulation lifetime permeability $\alpha_{SIM}$. The method 200 then optionally include, for example, receiving the simulation lifetime data which is generally associated with the test structure, and matching the measured lifetime $t_{REAL}$ of the test structure to the simulation lifetime $t_{SIM}$ from the simulation lifetime data, and assigning a barrier permeability value to the test barrier from a simulation lifetime permeability $\alpha_{SIM}$ corresponding to the simulation lifetime $t_{SIM}$ based on the measured lifetime $t_{REAL}$ of the test structure.

Figure 4:
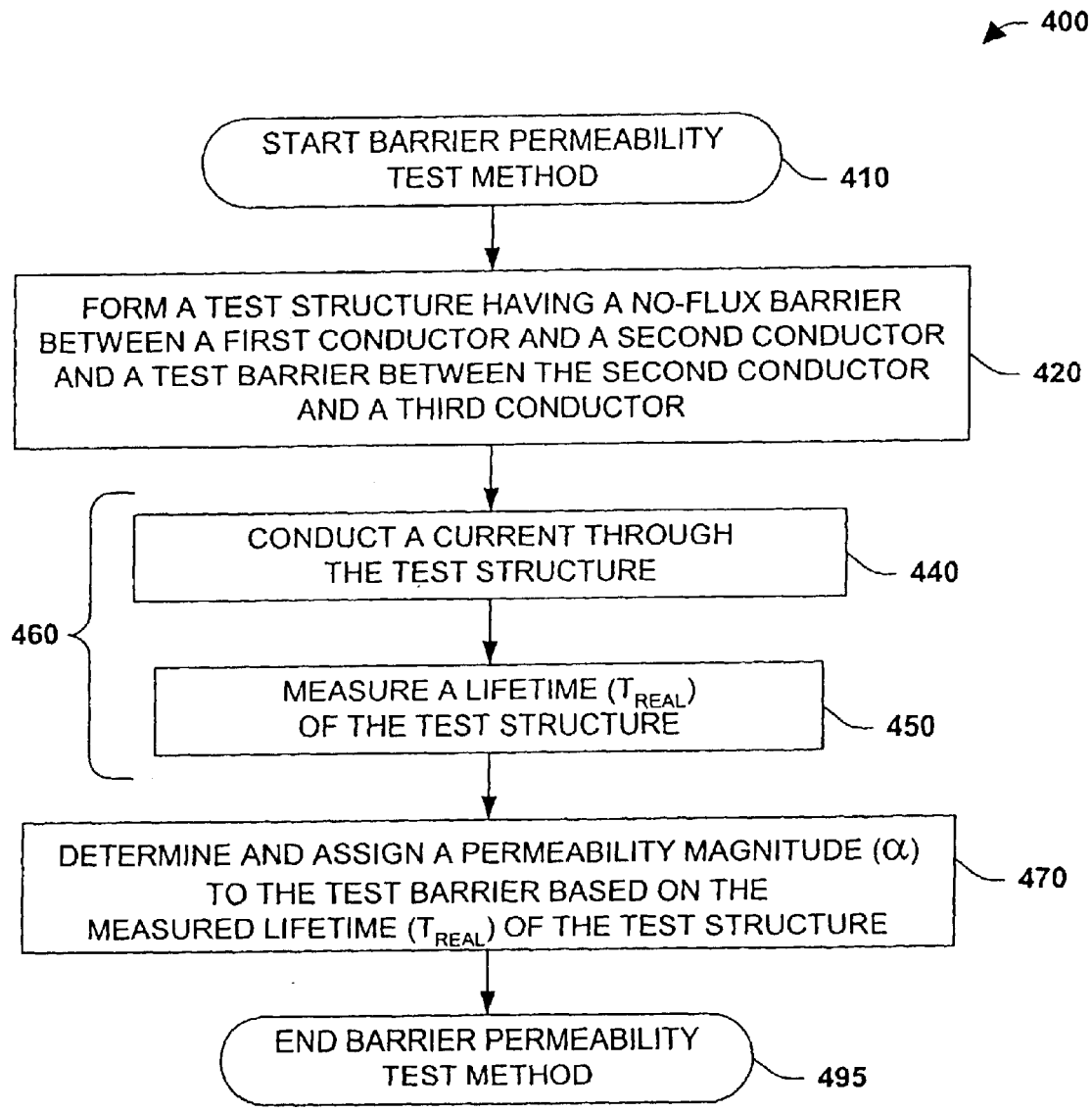
FIG. 4 is a flow diagram illustrating exemplary method for ascertaining a barrier permeability in association with another aspect of the present invention.

Referring to FIG. 4, another exemplary test method 400 is illustrated for a barrier permeability test method in a test structure in association with an aspect of the present invention. The exemplary EM test structure allows for the assessment of barrier permeability $\alpha$ at the via/supply-line barrier interface. The test structure also assures the prevention of mass flux through the barrier from the cathode via of the test line, by providing a no-flux barrier (flux blocking boundary) at the cathode end of the test line. This no-flux barrier guarantees that a void or extrusion will not form beyond the test line, via, or supply line. Such a boundary may be formed, for example, by depositing a much thicker barrier in the test line via, while depositing the barrier of interest in the supply line via.

The method 400 of FIG. 4 comprises forming a test structure having a no-flux barrier between a first conductor and a second conductor within a via, wherein the second conductor forms an interconnect, and a test barrier between the second conductor and a third conductor within a via. The method 400 further comprises conducting a current through the test structure and measuring a time to failure (lifetime) of the test structure. A barrier permeability value is then assigned to the test barrier of the test structure based on the measured lifetime. The test method proceeds similar to that of the method described in FIGS. 2 and 3, except that another exemplary test structure is used in the method, and as such, the common areas of the method need not be described again.

The barrier permeability test method begins at step 410. At 420 a test structure is formed having a no-flux barrier between a first conductor and a second conductor, and a test barrier between the second conductor and a third conductor at a via. At 440, a current (e.g., a substantially constant current from a constant current source) is conducted through the test structure, wherein electrons flow from the first conductor through the no-flux barrier to the second conductor forming an interconnect, through the test barrier and into the third conductor. The lifetime of the test structure is measured at 450, for example, by looking for a predetermined change of resistance from an initial value of the test structure, as described in the flow diagram 260 of FIG. 3.

Thereafter, referring back to FIG. 4, a barrier permeability value $\alpha$ is assigned to the test barrier of a test structure at 470 based on the measured lifetime of the test structure. The operation thereafter ends at 495, and the method 400 may be repeated for subsequent barrier permeability tests of additional test structures.

Optionally, the method 400 and as described in the method 200 may also be expanded to include the use of a processor or computer type simulator, for example, to supply simulation lifetime data which is generally associated with the test structure for assigning a barrier permeability value to the test barrier from a simulation lifetime permeability $\alpha_{SIM}$ corresponding to the simulation lifetime $t_{SIM}$ based on the measured lifetime $t_{REAL}$ of the test structure. The methodology 400 thus provides a test method to determine the barrier permeability of a test structure and assign a barrier permeability value $\alpha$ to the test barrier of a test structure based on the measured lifetime of the test structure.

Another aspect of the present invention further provides a method wherein, a second test structure is provided. The second test structure comprises a first conductor, a second conductor, wherein the second conductor forms an interconnect, and a third conductor, respectively. A no-flux barrier is disposed between the first and second conductor, and also between the second and third conductor, wherein the no-flux barrier is substantially impermeable to mass flux, and is substantially identical to the no-flux barrier of the first test structure. Further, the second conductor length and cross-sectional area of the first and second test structures are also substantially identical. The exemplary method comprises conducting a current through the second test structure, while measuring a lifetime of the second test structure, and confirming whether the no-flux barrier of the first test structure is substantially impermeable to mass flux based on the lifetime of the second test structure, which is substantially identical to the no-flux barrier of the first test structure. If the impermeability of the no-flux barrier is confirmed, then one can be more certain that a failure of the first structure is due to the permeability of the test barrier associated therewith.

For example, the second test structure may have a much thicker no-flux barrier disposed between the first and third conductors, or may use different material and a different thickness by which mass flux is prevented from traveling from the cathode end. Regardless of the scheme used to produce the no-flux barrier, the no-flux barrier of the second test structure is intended to be substantially identical to the no-flux barrier of the first test structure, to test verify that the no-flux barrier of the first test structure is truly impermeable to mass flux.

Figure 5:
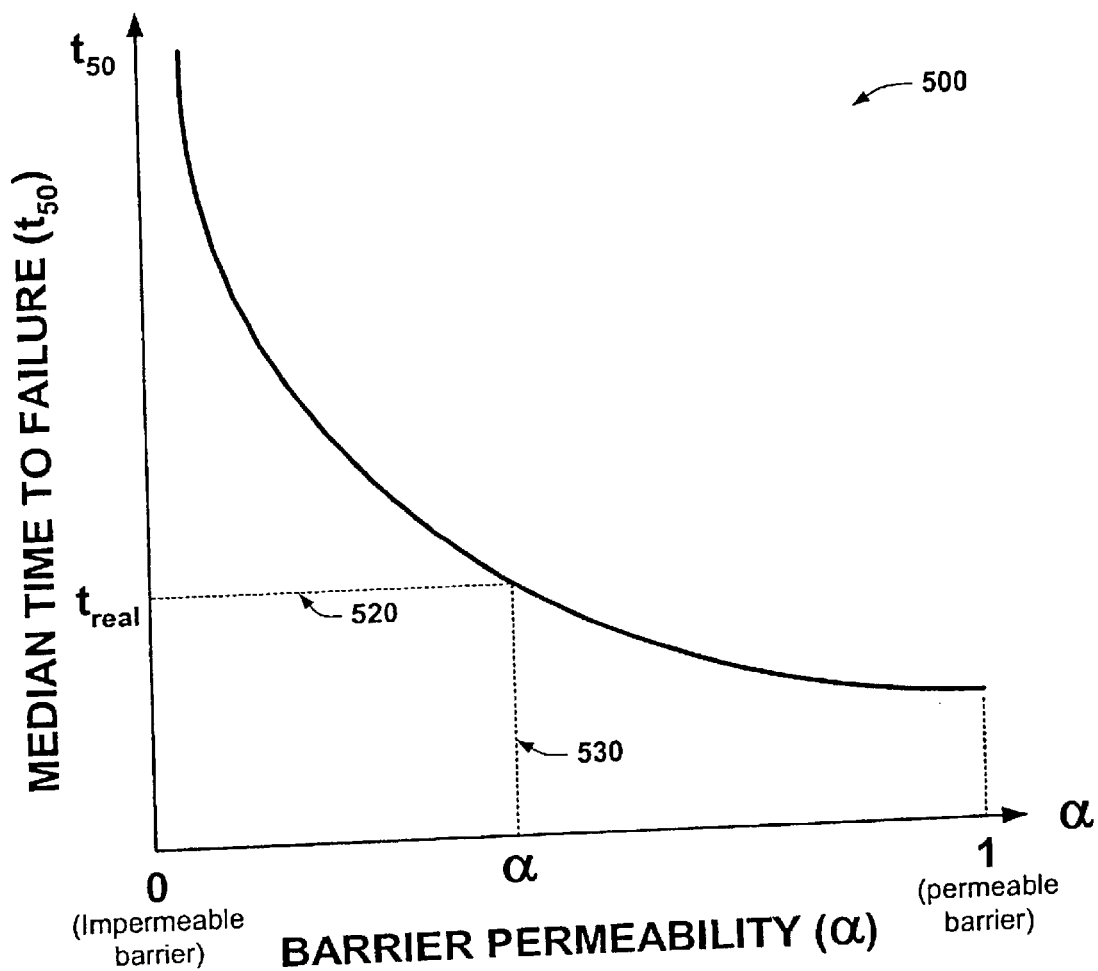
FIG. 5 is an exemplary plot of the median time to failure vs. barrier permeability a relationship of an EM test structure in accordance with an aspect of the invention.

FIG. 5 is a plot 500 illustrating, in one example, the median time to failure vs. barrier permeability $\alpha$ relationship of an EM test structure in accordance with an aspect of the invention. The permeability $\alpha$ has been characterized in one example as the fraction of the atomic flux of the barrier under evaluation compared to a completely permeable boundary. As such, the permeability $\alpha$ of a barrier in the present example ranges from 0 to 1, wherein an impermeable barrier is represented by 0, and a completely permeable barrier is represented by 1. An impermeable barrier ($\alpha=0$) prevents mass flow through a boundary between the associated conductors, while a completely permeable barrier ($\alpha=1$) allows full atomic flux through the boundary between the associated conductors. For example, two conductors in direct contact without a barrier would closely represent a completely permeable barrier ($\alpha=1$), while a very thick barrier layer, or a tungsten plug may closely represent an impermeable barrier ($\alpha=0$).

Although exemplary range boundary values of 0 to 1 have been used for barrier permeability, other values may also be used to represent barrier permeability, for example, 0 to 100%, A to Z, or another range of values, wherein a metric of a magnitude value is provides which may be assigned to a barrier to reflect a degree of barrier permeability.

These characterizations of permeability and its range from an impermeable barrier ($\alpha=0$), to the completely permeable barrier ($\alpha=1$), set forth the theoretical boundaries of permeability. However, the real world teaches that neither extreme of permeability ($\alpha=0$, or 1), is likely to be fully achieved, wherein an impermeable barrier completely prevents every atom of mass flux, nor a completely permeable barrier completely allows mass flow passage of every atom. Further, the practical limits of lifetime testing, certainly cannot allow a true lifetime of testing to achieve the correlations made between a measured lifetime of a test structure and the permeability of a barrier. Therefore, within the context of the present invention, the boundaries of permeability discussed will generally relate to those achieved within predetermined testing limits.

For example, the predetermined limit $R_T$ for the change of resistance of the test structure provides an acceptable testing limit, without having to wait indefinitely, yet achieving a practical EM failure criteria for determining the measured lifetime $t_{REAL}$ 520. The maximum allowable testing time limit $t_{MAX}$ used in the methods of the present invention, also provides an acceptable maximum life testing time for the test structure, when operated at a predetermined temperature and at a predetermined current density, by which time an experimental population of test structures will have demonstrated an acceptable distribution of measured lifetimes. FIG. 5 further illustrates a plot 500 of the results of such an experimental lifetime test on a population of test structures, and illustrates an exemplary measured lifetime $t_{REAL}$ 520 which correlates to a barrier permeability $\alpha_{REAL}$ 530.

Thus within the context of the present invention, a test structure which did not fail during the measured lifetime test, has not exhibited the predetermined resistance change within the maximum allowable testing time. Therefore the test structure is considered to be immortal to EM failure and have an impermeable barrier (e.g., a no-flux barrier), wherein a permeability value of ($\alpha=0$) is assigned to the barrier. By contrast, a test structure which failed during the measured lifetime test at $t_{REAL}$ 520, has exhibited the predetermined resistance change within the maximum allowable testing time. Therefore the test structure is considered to be mortal to EM failure and have a permeable barrier, wherein a permeability value of $\alpha_{REAL}$ 530 is assigned to the barrier based on the measured lifetime $t_{REAL}$ 520.

Conventional simulations (e.g., the MIT/EmSim) of test structures closely associated with a selected test structure, have also been shown to reasonably predict the lifetime of an interconnect of a given test structure, and may be used in the assessment of barrier permeability. Thus, simulations may be used to create a simulation results plot similar to that of FIG. 5. Therefore, a median time to failure (lifetime) may be experimentally determined and used as a basis in a simulation to predict a permeability value $\alpha$. Such a plot 500 may be constructed using any number of different types of EM models and all such models are contemplated as falling within the scope of the present invention.

For example, assume an exemplary EM test structure is life tested and produces a measured lifetime $t_{REAL}$. A simulation may be created which is generally associated with the exemplary test structure and plots the relationship data between a simulation lifetime $t_{SIM}$ vs. a simulation barrier permeability $\alpha_{SIM}$ relationship of the exemplary test structure. Then the measured lifetime $t_{REAL}$ may be matched or otherwise correlated to the simulation lifetime $t_{SIM}$ which then corresponds to the simulation barrier permeability $\alpha_{SIM}$ based on the measured lifetime $t_{REAL}$ of the exemplary test structure.

For example, if the exemplary test structure and associated simulation provided the following data:

| $t_{REAL}$ | $t_{SIM}$ | $\alpha_{SIM}$ |
|---|---|---|
| 40 hrs. | 40 hrs. | .8 |
| 100 hrs. | 100 hrs. | .6 |

-continued

| $t_{REAL}$ | $t_{SIM}$ | $\alpha_{SIM}$ |
|---|---|---|
| 200 hrs. | 200 hrs. | .5 |
| 400 hrs. | 400 hrs. | .4 |
| 600 hrs. | 600 hrs. | .2 |

Then, according to an aspect of the present invention, matching the measured lifetime $t_{REAL}$ to the simulation lifetime $t_{SIM}$ corresponding to the simulation barrier permeability $\alpha_{SIM}$, provides a barrier permeability value $\alpha$ which may be assigned to the test barrier based on the measured lifetime $t_{REAL}$ of the test structure. In another aspect of the invention, heating the test structure during the life testing provides accelerated lifetime test results.

Alternately, historical data from previous actual measured lifetime tests of a population of similar test structures may be used as a basis for the relationship data. The relationship data may take on the form of a look-up table, a plot, or any other scheme which provides data for the lifetime vs. $\alpha$ relationship.

The median time to failure may be symbolized by $t_{50}$, which is generally the median lifetime of a test structure. According to Black's equation:

$$t_{50} = Aj^{-n} \exp(E_A/kT)$$

where: A=current in Amps, j=current density, $E_A$=activation energy, k=Boltzman's constant, and T=temperature.

Figure 6:
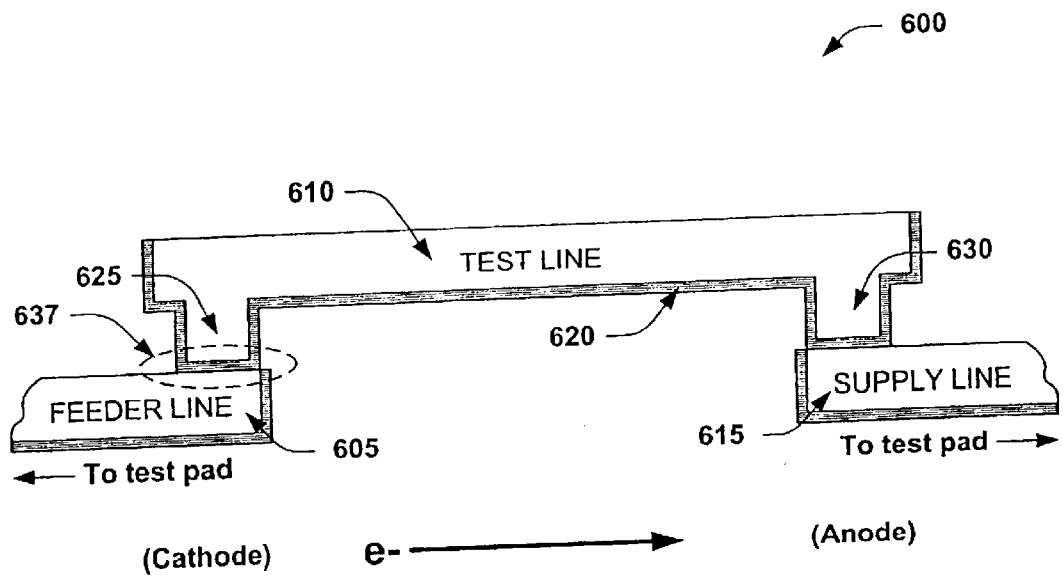
FIG. 6 is a cross-sectional view of a conventional test structure, illustrating connections and the current flow during an electromigration test.

FIG. 6 is a cross-sectional view of a conventional test structure 600, illustrating connections and the current flow during an electromigration test. The conventional test structure 600 of FIG. 6 is a two metal layer interconnect structure having a first conductor 605, a second conductor 610, a third conductor 615, and a barrier 620 disposed between the first conductor 605 and the second conductor 610 at a cathode via 625 and disposed between the second conductor 610 and the third conductor 615 at an anode via 630. The second conductor 610 forms an interconnect between the first and third conductors. Again, electrons are indicated as flowing from the cathode to the anode. FIG. 6 also illustrates a test area 637, in the region of the cathode via 625, which has substantially the same barrier layer and thickness as that of the region of the anode via 630.

The conventional test structure of FIG. 6 may rely on an assumption that the test structure being tested, has no mass flux entering from the cathode/feeder line, but may in fact, have a mass flux which may reduce or invalidate the effectiveness of testing lifetime measurements under investigation. Although, some conventional EM test methods or test structures may have attempted to determine the lifetime of such structures, to analyze the effects of EM on various structures, the effect of a barrier layer on EM, or may have indicated improved or worsened lifetimes, they did not attempt to quantify the magnitude of the barrier permeability itself. Rather, upon lifetime testing, a barrier was deemed either to be sufficiently effective or not sufficiently effective without any further characterization of the barrier.

Figure 7:
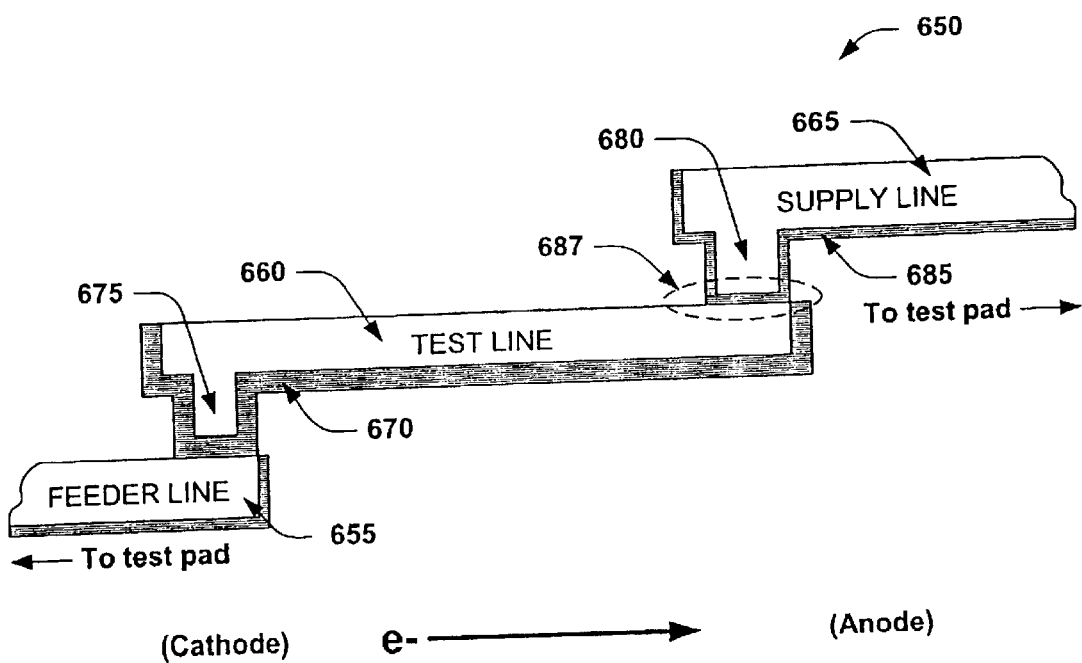
FIG. 7 is a cross-sectional view of an exemplary test structure, illustrating a no-flux barrier, a test barrier, connections and current flow during an electromigration lifetime test for assigning a permeability value to the test barrier in accordance with an aspect of the invention.

FIG. 7 is a cross-sectional view of an exemplary test structure 650 in accordance with an aspect of the invention. The structure 600 includes a no-flux barrier, a test barrier, and connections and current flow illustrated during an electromigration lifetime test.

The exemplary test structure 650 of FIG. 7 comprises a first conductor 655, a second conductor 660, and a third conductor 665. The test structure 650 further comprises a no-flux barrier 670 disposed between the first conductor 655 and the second conductor 660 at a cathode via 675, and a test barrier 685 disposed between the second conductor 660 and the third conductor 665 at an anode via 680. The test barrier 685 is then tested and is assigned a barrier permeability value, based on a measured lifetime. The first conductor 655 functions as a cathode feeder-line, while the second conductor 660 forms an interconnect (test line) between the first and third conductors. Lastly, the third conductor 665 functions as an anode supply line. Again, electrons are indicated as flowing from the cathode to the anode and reflect current flow through the test structure 650. FIG. 7 also illustrates a test area 687 having the test barrier 685 at the anode via 680 with a substantially different barrier or thickness than that of the no-flux barrier 670 at the cathode via 675. Therefore in the present example, the no-flux barrier 670 and the test barrier 685 are the same material, but differ in that the no-flux barrier 670 is substantially more thick to substantially ensure no mass flux there through.

During a barrier permeability testing operation of the exemplary test structure 650 of FIG. 7, a substantially constant current is conducted through the test structure 650, in order to measure a time to failure (measured lifetime $t_{REAL}$) of the test structure 650. A barrier permeability value α is then determined and assigned to the test barrier of the test structure, based on the measured lifetime $t_{REAL}$.

The system of the present invention provides a no-flux barrier 670 at the cathode via 675 for eliminating the effects of mass flux from the first conductor (cathode feeder-line) 655. Such a no-flux barrier 670 (boundary) can be formed by depositing, for example, a much thicker barrier or another barrier material associated with the test line 660, while depositing the barrier of interest in the supply line 665. Alternately, a tungsten plug or other substantially impermeable conductive material may be used as a no-flux barrier. The no-flux barrier at the cathode via 675 effectively prevents mass flux from the cathode feeder-line flowing into the interconnect, thereby isolating the interconnect from any unwanted damage or benefit from this source and eliminating a source of testing contamination to the lifetime measurement. In contrast to the conventional two-level EM test structures which are desensitized to barrier permeability by the use of wider feeder lines, the no-flux barrier 670 is particularly beneficial to prevent this mass flux and testing contamination, regardless of feeder line width.

In addition, a carefully chosen combination of the test line (interconnect) length L and the current density j provides a test structure which is otherwise immortal to EM failure. The reasoning for this is as follows: under certain conditions, a line may be considered immortal to EM failure; that is, it may never fail due to EM under these conditions. Shortening the interconnect line is a well known way to achieve immortality. The critical length below which the interconnect is immortal is denoted as $L_{CRIT}$ (a.k.a. the "critical Blech length") in the context of this invention. This assumes, however, that the barrier is impermeable. If the barrier were to become permeable, that line would fail even if the length is below the critical length value.

It should be noted at this point, however, that the term critical length or $L_{CRIT}$, is something of a misnomer, as the length of the interconnect itself is not all that determines immortality to EM failure. Rather, an interconnect of a test structure is said to become immortal to EM failure if the product (test product) of the interconnect length L and the current density j through the interconnect is less than a critical product, wherein $(jL)_{TEST}<(jL)_{CRIT}$. These conditions for interconnect immortality occur when there is a balance between an electron wind force and a back stress force. One force is in the direction of the electron flow, and is caused by electrons imparting their momentum on the metallic ions of the interconnect conductor. The second force is the back-stress which is in the opposite direction from the electron flow. Back-stress wants to move the metallic ions in the opposite direction from the electron flow. Thus it is believed that when the force from the electron flow is not equal to the force from the back-stress, mass flow takes place producing the voids in a conductor and ultimately EM failure.

The present invention combines these concepts into a test structure and testing methodology, wherein a magnitude of a barrier permeability of a test barrier may be quantified, for example, based on the following features and test conditions:

1. Utilizing a no-flux barrier at the cathode via eliminates the effects of mass flux from the cathode feeder-line to protect the interconnect.
2. Maintaining the test product less than the critical product, wherein $(jL)_{TEST}<(jL)_{CRIT}$ assures the interconnect will not fail.
3. Measuring the test structure lifetime using 1 & 2 above, ensures primarily only the magnitude of barrier permeability α affects the measured lifetime.

Figure 8A:
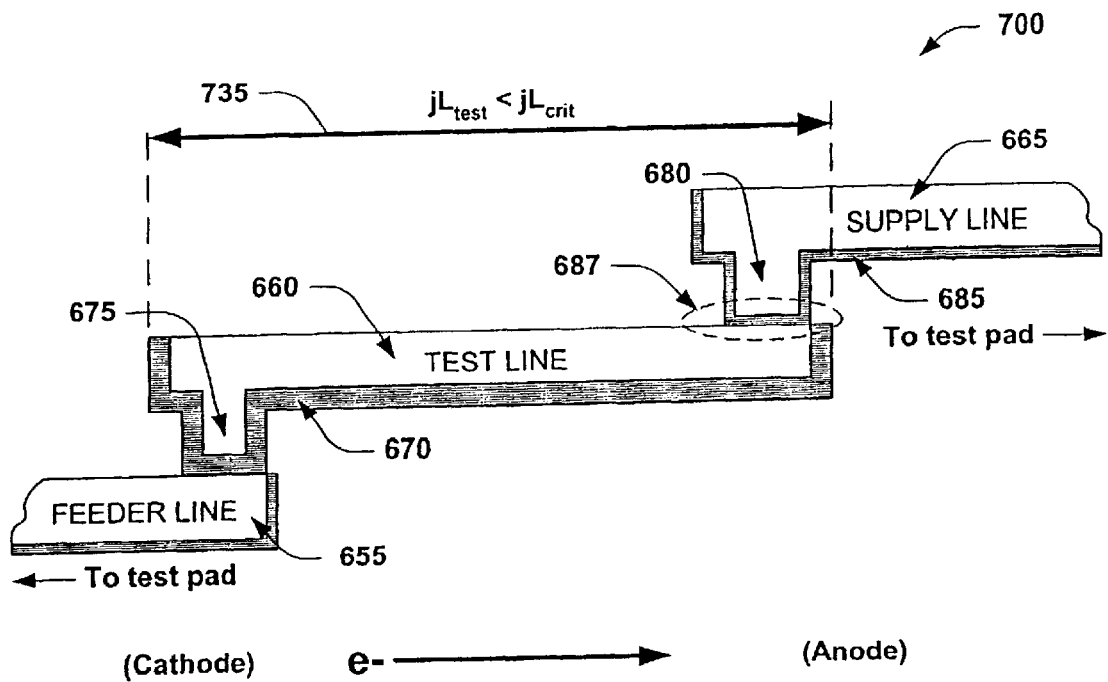
FIG. 8A is a cross-sectional view of the exemplary test structure of FIG. 7, illustrating a test structure design feature which facilitates assigning a permeability value to the test barrier in accordance with an aspect of the invention.

FIG. 8A is a cross-sectional view of an exemplary test structure 700, illustrating a no-flux barrier, a test barrier, connections and current flow during an electromigration lifetime test. The exemplary test structure 700 of FIG. 8A follows the same general description as that of FIG. 7, and therefore need not be described again, except for the addition of the test line length 735 of FIG. 8A, and its features.

Rather than identifying the physical length of an interconnect (test line) here as only a line length $L_{TEST}$ which must be less than a critical line length $L_{CRIT}$, as described above for FIG. 7, a better result is obtained by representing the test line length 735 as $(jL)_{TEST}<(jL)_{CRIT}$. As discussed, this takes into account the interconnect length L and the current density j through the interconnect, wherein the test product $(jL)_{TEST}$ must be less than the critical product $(jL)_{CRIT}$. The physical line length portion of the test line length 735 product is measured from the cathode via 675 to the anode via 680.

Figure 8B:
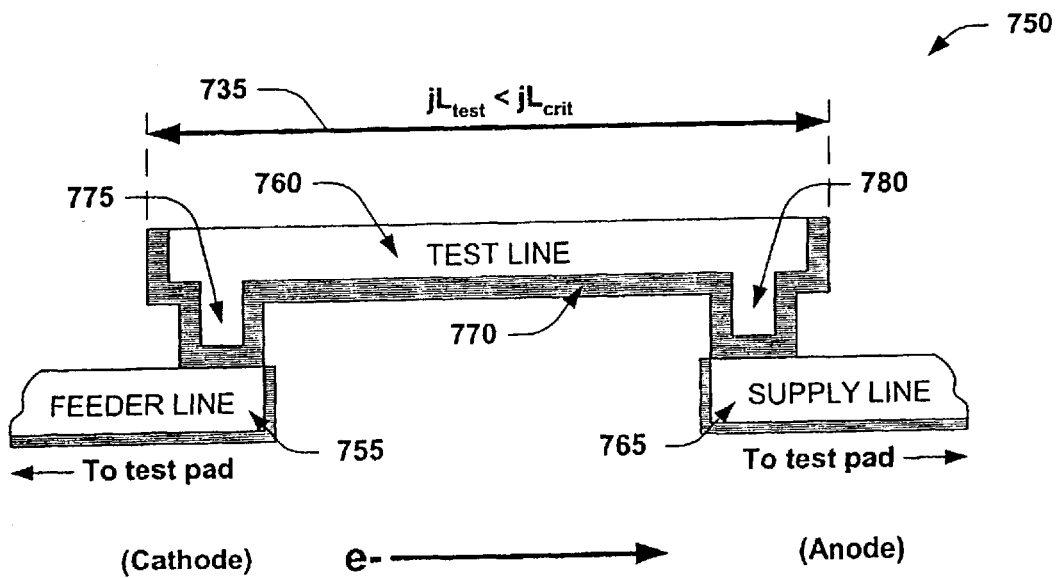
FIG. 8B is a cross-sectional view of an exemplary verification test structure, illustrating a no-flux barrier at both ends of the interconnect, connections and current flow during an electromigration lifetime test for verification of a no-flux barrier in accordance with an aspect of the invention.

FIG. 8B is a cross-sectional view of an exemplary verification (second) test structure 750, illustrating a no-flux barrier at both ends of the interconnect, connections and current flow during an electromigration lifetime test for verification of a no-flux barrier in accordance with an aspect of the invention. The exemplary verification test structure 750 of FIG. 8B is a two metal layer interconnect structure having a first conductor 755, a second conductor 760, and a third conductor 765. A no-flux barrier 770 is disposed between the first conductor 755 and the second conductor 760 at a cathode via 775 and also between the second conductor 760 and the third conductor 765 at an anode via 780. The second conductor 760 forms an interconnect between the first and third conductors. Again, electrons are indicated as flowing through the test structure from the cathode to the anode.

FIG. 8B further illustrates that the no-flux barrier 770 at the cathode via 775 and the anode via 780 is a substantially identical barrier to that of the no-flux barrier 670 at the cathode via 675 of FIG. 8A. Also, as with the test structure (the first test structure) of FIG. 8A, the verification test structure 750 of FIG. 8B, also has a test line length 735 represented as $(jL)_{TEST}<(jL)_{CRIT}$, wherein the lengths, cross-sectional area, and current density of the test lines of both test structures are substantially identical. The verification test structure 750 provides an optional structure whereby it may be verified (confirmed) that the no-flux barrier, in fact, prevents mass flux from the test structure of FIG. 8A which contains the actual test barrier 685 of the test area 687.

For example, to verify that a given no-flux barrier truly prevents flux for a test structure which is to be lifetime tested, a test structure and a verification test structure may be formed, wherein the test lines of both structures have substantially identical length, cross-sectional area, wherein $(jL)_{TEST} < (jL)_{CRIT}$, and wherein the test conditions (e.g., temp, current density, etc.) for both are substantially identical. The structures may be easiest to make substantially identical in these specific areas, if both structures are processed in the same metalization layer. Note, not all areas of both structures are made identical.

The verification (second) test structure, and optionally the test structure (the first test structure), is then EM lifetime tested for the no-flux barrier verification test. If the lifetime of the verification test structure is determined to be mortal (finite), then the no-flux barrier is permeable to mass flux and may be considered inadequate for the test structure. In this case, for example, the no-flux barrier may need to be made thicker, another barrier material selected, the test current reduced, or another variable changed in the barrier. Otherwise, if the lifetime of the verification test structure is determined to be substantially immortal, then the no-flux barrier is verified impermeable to mass flux for the test structure.

Thus, unlike a conventional test structure, an aspect of the present invention provides a test structure and method, wherein a magnitude of a barrier permeability of a test barrier may be quantified. The test structure utilizes a no-flux barrier at the cathode via to prevent mass flux contamination from the cathode feeder-line into the interconnect, wherein the no-flux barrier may be a substantially different thickness or barrier material than the test barrier. The test structure further includes a test barrier deposited in the supply line at a via between the interconnect and the anode supply-line, whereby the test barrier may be a substantially different thickness or barrier material than the no-flux barrier.

Figure 9:
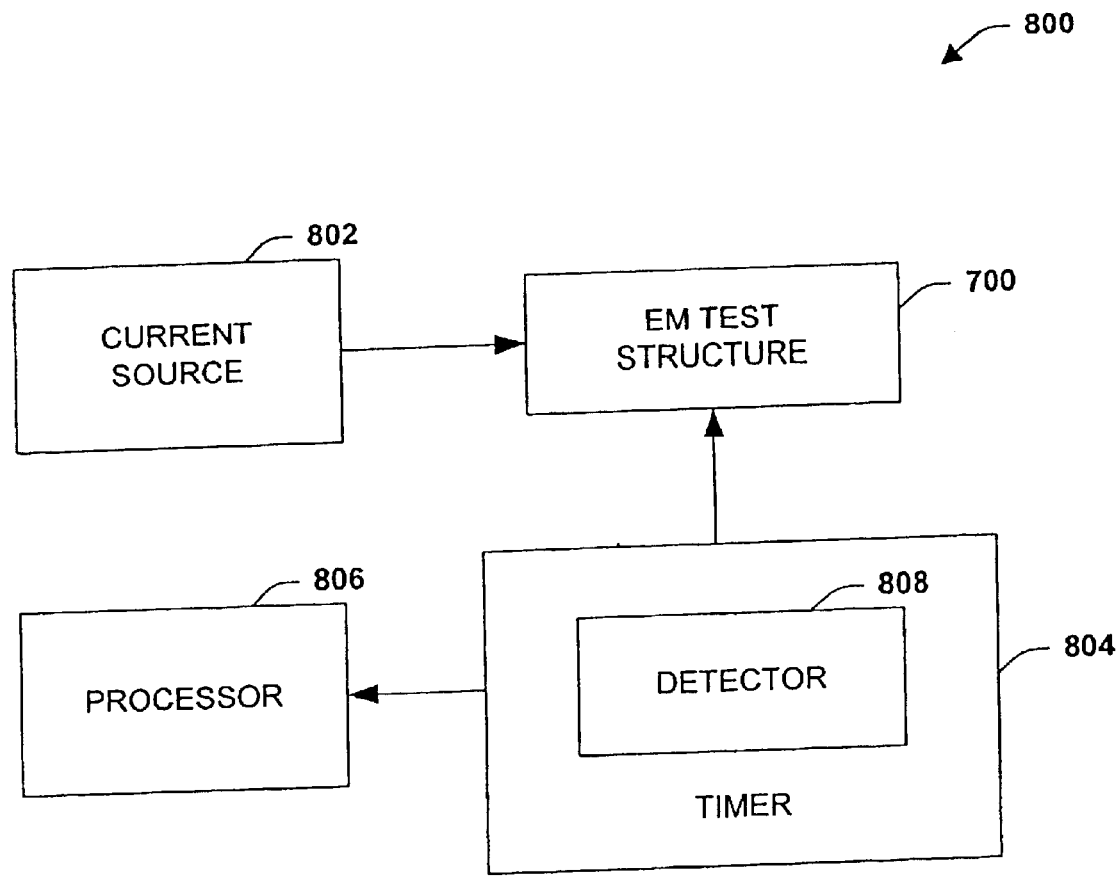
FIG. 9 shows a block diagram of a system for determining the magnitude of the barrier permeability within the interconnect test structure, according to an embodiment of the present invention.

In another example of the present invention, as illustrated in FIG. 9, a system 800 includes a current source 802, for example, to supply a substantially constant current through the test structure (e.g., structure 700 of FIG. 8A). In a further example of the present invention, the system 800 includes a timer 804 operable to measure the lifetime of the test structure, and a processor 806 operable to determine the value of barrier permeability α of the test barrier based on the measured lifetime of the test structure.

Yet another exemplary aspect of the present invention provides a system, wherein the timer, further comprises a detector 808 to measure a change of resistance of the test structure 700, wherein a time to failure of the test structure is measured while measuring a change of resistance of the test structure. The time to failure, for example, may be determined as the time at which the resistance of the test structure changes from an initial resistance by some predetermined percentage, thus defining the test structures' lifetime.

Other variations of the exemplary test structure are contemplated as falling within the scope of the present invention, whereby a magnitude of a barrier permeability of a test barrier may be quantified for applications in devices which include semiconductors, integrated circuits, and the manufacturing of such devices.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

Figure 10:
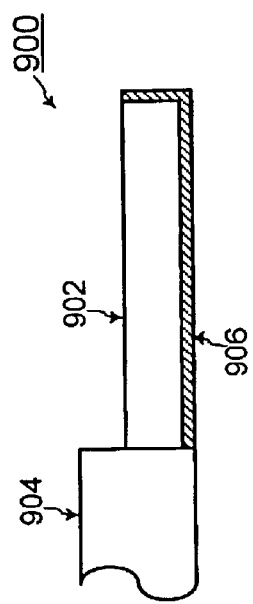
FIG. 10 shows a cross-sectional view of a feeder line formed for an interconnect test structure, according to another embodiment of the present invention.
Figure 11:
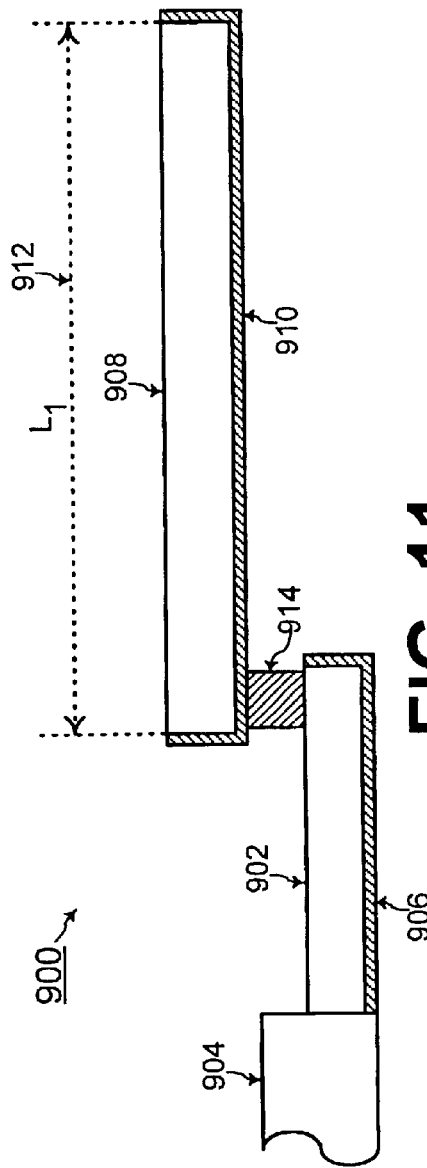
FIG. 11 shows a cross-sectional view of a no-flux via and a test line formed to be coupled to the feeder line of FIG. 10 for the interconnect test structure, according to an embodiment of the present invention.
Figure 12:
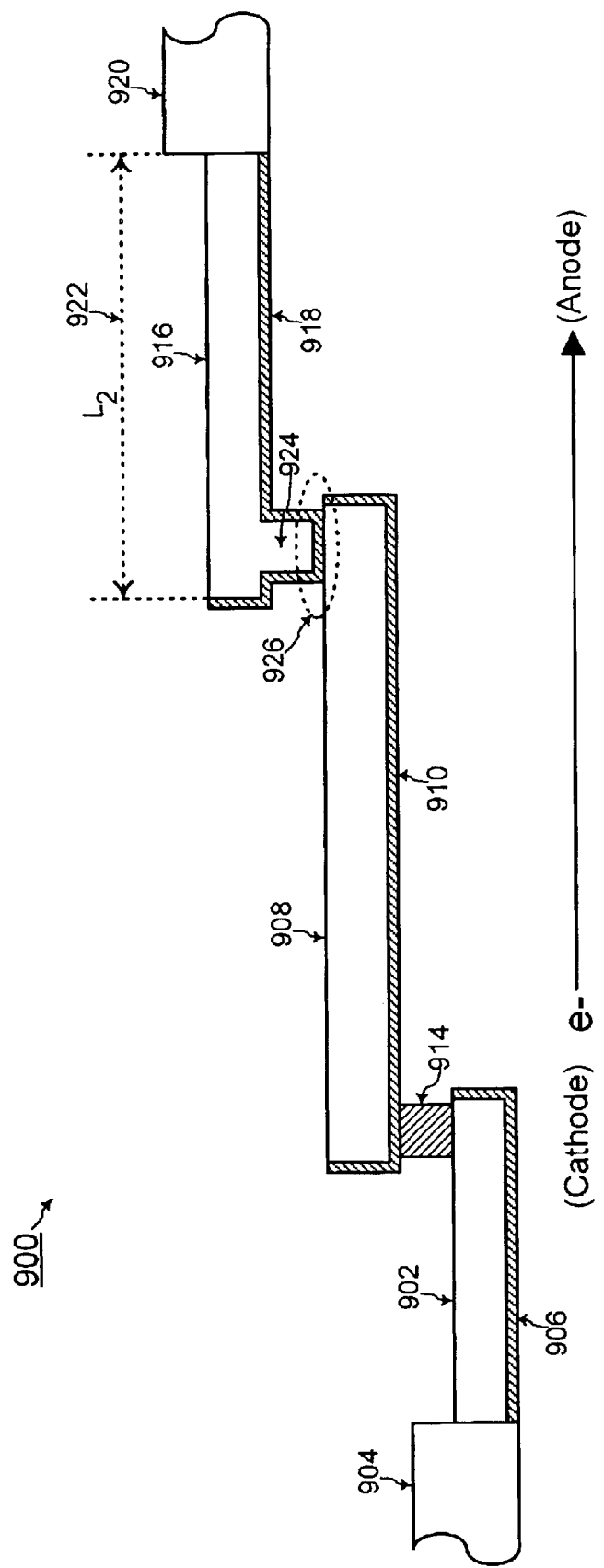
FIG. 12 shows a cross-sectional view of a supply line with a barrier layer material interface to the test line of FIG. 11 for the interconnect test structure, according to an embodiment of the present invention.

FIGS. 10, 11, and 12 are cross-sectional views illustrating formation of an interconnect test structure for determining a magnitude of electromigration permeability, α, of a layer material within an interconnect test structure 900 of another embodiment of the present invention. Referring to FIG. 10, the interconnect test structure 900 includes a feeder line 902 coupled to a first test pad 904. In an example embodiment, the feeder line 902 is comprised of copper and is surrounded by a diffusion barrier layer material 906. The diffusion barrier layer material 906 prevents diffusion of copper of the feeder line 902 into surrounding insulator or semiconductor material, and such diffusion barrier layer materials are known to one of ordinary skill in the art of integrate circuit fabrication.

Referring to FIG. 11, the interconnect test structure 900 is further formed to include a test line 908 on another interconnect level from the interconnect level of the feeder line 902. In an example embodiment, the test line 908 is comprised of copper and is surrounded by a diffusion barrier layer material 910. The diffusion barrier layer material 910 prevents diffusion of copper of the test line 908 into surrounding insulator or semiconductor material, and such diffusion barrier layer materials are known to one of ordinary skill in the art of integrate circuit fabrication. In addition, the test line 908 is formed to have a first length, $L_1$, 912. The "length" of an interconnect line is generally defined herein as the length portion of the interconnect line through which current is conducted during determination of the electromigration life-time of the interconnect structure having that interconnect line.

The test line 908 and the feeder line 902 are formed as two separate interconnect levels. For example in FIG. 11, the test line 908 is formed in an upper interconnect level, and the feeder line 902 is formed in a lower interconnect level. Processes for forming interconnect lines within separate interconnect levels are known to one of ordinary skill in the art of integrated circuit fabrication. In an aspect of the present invention, a no-flux structure 914 is formed between the feeder line 902 and the test line 908 for coupling the test line 908 to the feeder line 902. In one embodiment of the present invention, the no-flux structure 914 is a via comprised of tungsten.

Referring to FIG. 12, the interconnect test structure 900 is further formed to include a supply line 916 on another interconnect level from the interconnect level of the test line 908. In an example embodiment, the supply line 916 is comprised of copper and is surrounded by a diffusion barrier layer material 918. The diffusion barrier layer material 918 prevents diffusion of copper of the supply line 916 into surrounding insulator or semiconductor material, and such diffusion barrier layer materials are known to one of ordinary skill in the art of integrate circuit fabrication. The supply line is coupled to a second test pad 920. In addition, the supply line 916 is formed to have a second length, $L_2$, 922.

The test line 908 and the supply line 916 are formed as two separate interconnect levels. For example in FIG. 12, the test line 908 is formed in the lower interconnect level, and the supply line 916 is formed in the upper interconnect level. Processes for forming interconnect lines within separate interconnect levels are known to one of ordinary skill in the art of integrated circuit fabrication. A via structure 924 is formed as part of a damascene structure of the supply line 916 for coupling the supply line 916 to the test line 908. The diffusion barrier layer material 918 formed at the bottom of the via structure 924 is at the interface 926 of interest between the supply line 916 and the test line 908. The interconnect test structure 900 is used for assessing the magnitude of electromigration permeability, $\alpha$, of that portion of the diffusion barrier layer material 918 formed at the bottom of the via structure 924 and at the interface 926 between the supply line 916 and the test line 908.

Figure 13:
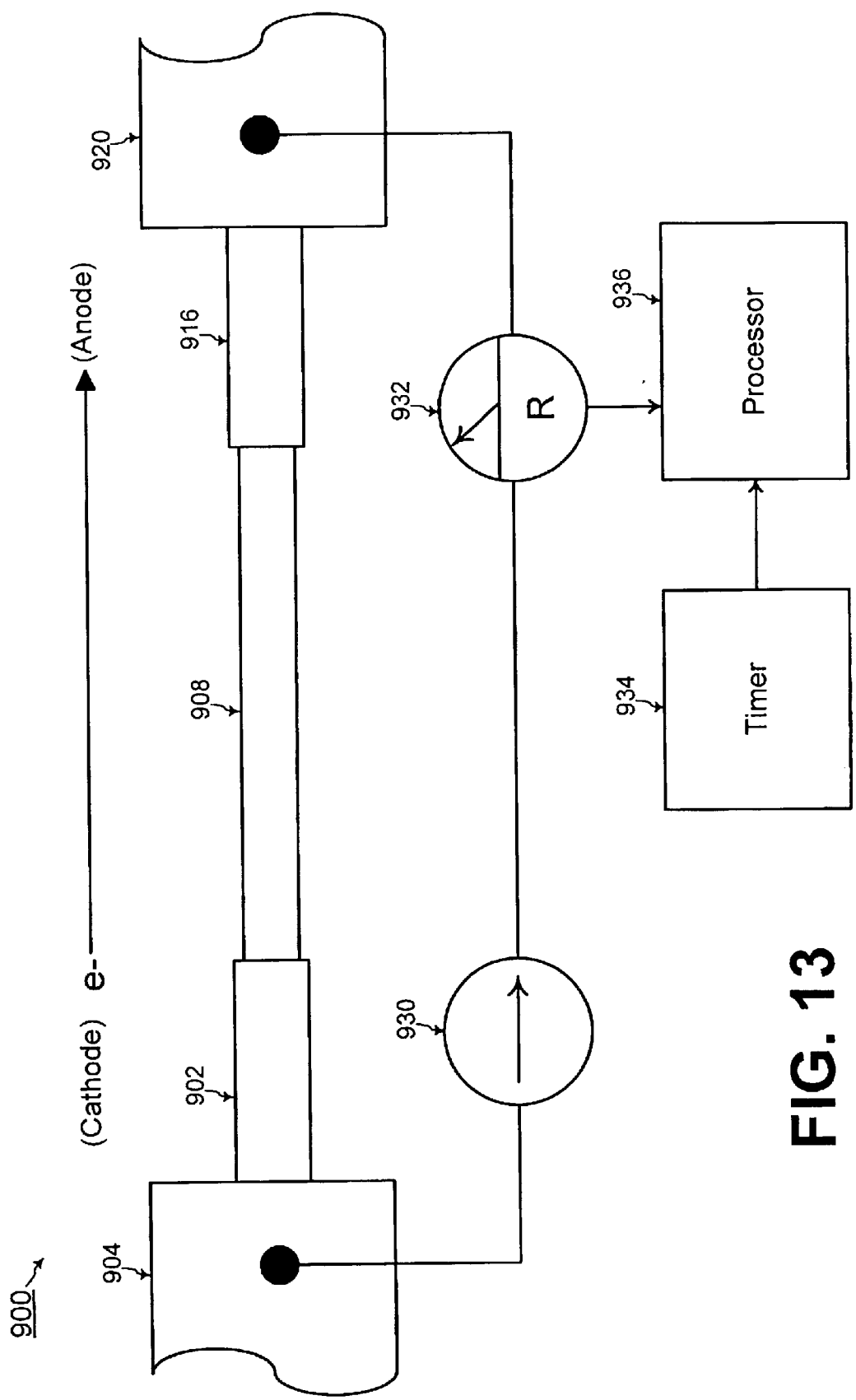
FIG. 13 shows a top view of the interconnect test structure of FIG. 12 with components of a system for determining the level of electromigration permeability of the barrier layer material between the test line and the supply line within the interconnect test structure of FIG. 12, according to an embodiment of the present invention.

Referring to FIG. 13, a system for determining the magnitude of electromigration permeability, $\alpha$, of that portion of the diffusion barrier layer material 918 formed at the bottom of the via structure 924, includes a current source 930 for conducting current through the supply line 916, the test line 908, and the feeder line 902. FIG. 13 shows a top view of the supply line 916, the test line 908, the feeder line 902, and the first and second test pads 904 and 920 of the interconnect test structure 900. In addition, the system includes a resistance meter 932 and a timer 934 coupled to a processor 936 for determining the electromigration life-time of the interconnect test structure 900.

The current source 930 is coupled between the first and second test pads 904 and 920 and provides the current flowing through the supply line 916, the test line 908, and the feeder line 902. The feeder line 902 is at the cathode end and acts as a source of electrons flowing into the test line 908. The supply line 916 is at the anode end and acts as a sink of electrons flowing out of the test line 908. The resistance meter 932 is also coupled between the first and second test pads 904 and 920 and measures the resistance of the interconnect test structure 900 as current from the current source 930 flows through the supply line 916, the test line 908, and the feeder line 902 of the interconnect test structure 900. Such a current source and resistance meter are individually known to one of ordinary skill in the art of electronics.

Referring to FIGS. 12 and 13, the level of current from the current source 930 determines a first current density $J_1$ through the test line 908 and a second current density $J_2$ through the supply line 916. The first current density $J_1$ through the test line 908 is determined by the level of current from the current source 930 and the area of the test line 908 (i.e., the cross-sectional area of the test line 908 going into the drawing page of FIG. 12), as known to one of ordinary skill in the art of integrated circuit fabrication. The second current density $J_2$ through the supply line 916 is determined by the level of current from the current source 930 and the area of the supply line 916 (i.e., the cross-sectional area of the supply line 916 going into the drawing page of FIG. 12), as known to one of ordinary skill in the art of integrated circuit fabrication.

Referring to FIGS. 11, 12, and 13, the first length $L_1$ and the first current density $J_1$ of the test line 908 are designed such that the product of such values ($J_1*L_1$) is less than a critical Blech length constant ($J*L)_{CRIT}$ corresponding to the test line 908, according to an aspect of the present invention. The critical Blech length constant ($J*L)_{CRIT}$ is a constant for an interconnect line depending on various processing parameters for the interconnect line such as the material comprising the interconnect line and the material surrounding the interconnect line for example, as known to one of ordinary skill in the art of integrated circuit fabrication.

When the current density, J, and the length, L, for an interconnect line is designed such that the product of such values (J*L) is less than the critical Blech length constant ($J*L)_{CRIT}$, then that interconnect line is immortal and does not exhibit electromigration failure, as known to one of ordinary skill in the art of integrated circuit fabrication. Similarly, the second length $L_2$ and the second current density $J_2$ of the supply line 916 are designed such that the product of such values ($J_2*L_2$) is less than the critical Blech length constant ($J*L)_{CRIT}$ corresponding to the supply line 916, according to an aspect of the present invention.

With such current densities and lengths of the test line 908 and the supply line 916, the test line 908 and the supply line 916 are designed to be individually immortal such that the test line 908 and the supply line 916 individually would not exhibit electromigration failure. Thus, when the interconnect test structure 900 having the combination of the test line 908 and the supply line 916 exhibits electromigration failure, that failure is attributable to the permeability of the barrier layer material 918 at the bottom of the via 924 and at the interface 926 between the test line 908 and the supply line 916.

Furthermore, a net current density and length product ($J*L)_{NET}$ for the test line 908 and the supply line 916 is greater than the critical Blech length constant ($J*L)_{CRIT}$ corresponding to the test line 908 and the supply line 916, according to an aspect of the present invention. The net current density and length product ($J*L)_{NET}$ for the test line 908 and the supply line 916 may be the sum of the products of the current densities and the lengths of the test line 908 and the supply line 916, ($J_1*L_1+J_2*L_2$), according to one embodiment of the present invention. Alternatively, the net current density and length product ($J*L)_{NET}$ for the test line 908 and the supply line 916 may be the product of the average $J_{ave}$ of the current densities $J_1$ and $J_2$ and the average $L_{ave}$ of the lengths $L_1$ and $L_2$ of the test line 908 and the supply line 916, ($J_1*L_1+J_2*L_2$), according to another embodiment of the present invention.

In any case, when the net current density and length product ($J*L)_{NET}$ for the test line 908 and the supply line 916 is greater than the critical Blech length constant ($J*L)_{CRIT}$, the interconnect test structure 900 is ensured to exhibit electromigration failure from permeability of the barrier layer material 918 at the bottom of the via 924. Thus, the permeability of the barrier layer material 918 may be detected and measured. Alternatively, the net current density and length product ($J*L)_{NET}$ for the test line 908 and the supply line 916 may have a different form of expression aside from just the examples of ($J_1*L_1+J_2*L_2$) or ($J_1*L_1+J_2*L_2$) for ensuring that the interconnect test structure 900 exhibits electromigration failure from permeability of the barrier layer material 918 at the bottom of the via 924.

Referring to FIG. 13, with such conditions designed for the test line 908 and the supply line 916 of the test interconnect structure 900, the processor 936 monitors the resistance of the test interconnect structure 900 versus time of current conducted through the test interconnect structure 900 as measured by the timer 934 to determine the electromigration life-time of the test interconnect structure 900, similarly as already described herein with respect to FIGS. 2, 3, and 4. In addition, the processor 936 then determines the electromigration permeability, α, of the barrier material 918 at the bottom of the via 924, similarly as already described herein with respect to FIG. 5.

In this manner, the electromigration life-time of the test interconnect structure 900 at which the test interconnect structure 900 exhibits electromigration failure is attributable to the permeability of the barrier material 918 at the bottom of the via 924 because of the following structural conditions of the test interconnect structure 900:

(1) the first length $L_1$ and the first current density $J_1$ of the test line 908 are designed such that the product of such values ($J_1*L_1$) is less than the critical Blech length constant $(J*L)_{CRIT}$ corresponding to the test line 908;

(2) the second length $L_2$ and the second current density $J_2$ of the supply line 916 are designed such that the product of such values ($J_2*L_2$) is less than the critical Blech length constant $(J*L)_{CRIT}$ corresponding to the supply line 916; and (3) the no-flux via structure 914 comprised of tungsten ensures no flux of interconnect material (i.e., because of no permeability through the no-flux via structure 914) between the feeder line 902 and the test line 908 such that the site of electromigration failure is isolated to the test line 908, the via structure 924 at the interface 926 of the test line 908 and the supply line 916, and the supply line 916.

Figure 14:
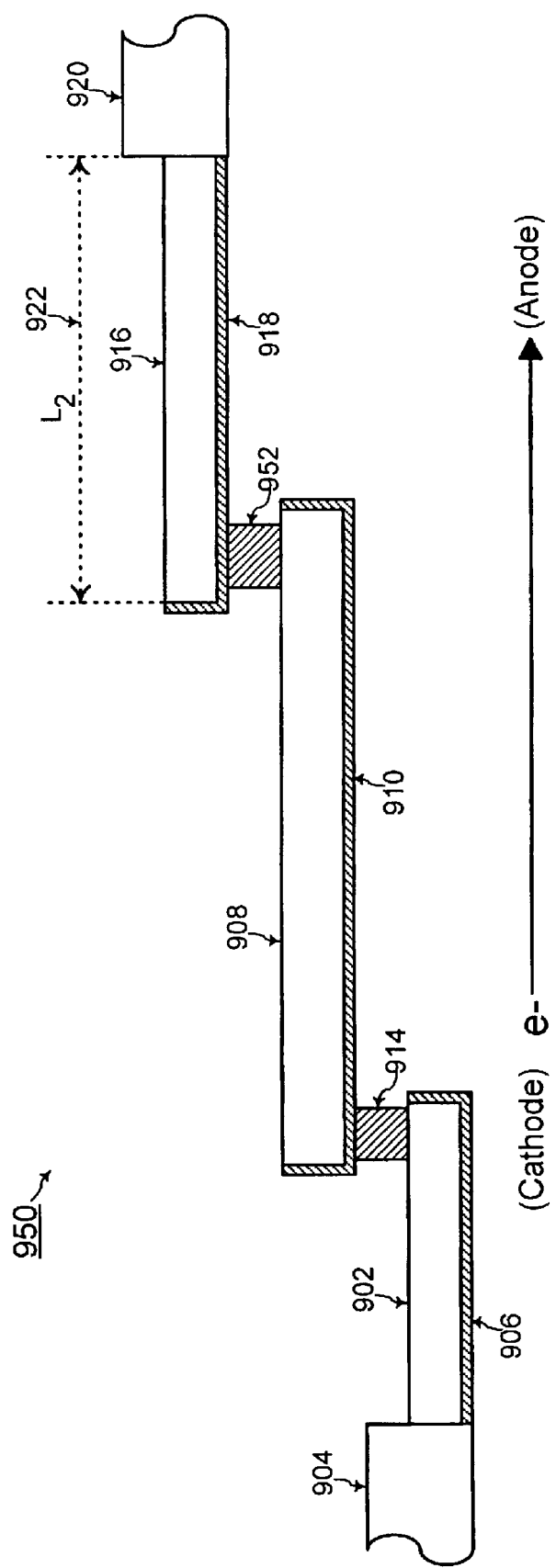
FIG. 14 shows a cross-sectional view of a no-flux verification test structure for the interconnect test structure of FIG. 12, according to an embodiment of the present invention.

FIG. 14 shows a cross-sectional view of a no-flux verification test structure 950. Elements having the same reference number in FIGS. 12 and 14 refer to elements having similar structure and function. Comparing FIGS. 12 and 14, the difference between the interconnect test structure 900 of FIG. 12 and the no-flux verification test structure 950 of FIG. 14 is that a second no-flux via structure 952 couples the test line 908 to the supply line 916 in FIG. 14 instead of the dual damascene via structure 924 of FIG. 12. The second no-flux via structure 952 in FIG. 14 is comprised of tungsten according to one embodiment of the present invention. When current is conducted through the feeder line 902, the test line 908, and the supply line 916 of the no-flux verification test structure 950 in FIG. 14 with the components 930, 932, 934, and 936 of the system of FIG. 13 as described herein, the no-flux verification test structure 950 in FIG. 14 should exhibit no electromigration failure for the following reasons:

(1) the first length $L_1$ and the first current density $J_1$ of the test line 908 within the no-flux verification test structure 952 in FIG. 14 are designed such that the product of such values ($J_1*L_1$) is less than the critical Blech length constant $(J*L)_{CRIT}$ corresponding to the test line 908;

(2) the second length $L_2$ and the second current density $J_2$ of the supply line 916 within the no-flux verification test structure 952 in FIG. 14 are designed such that the product of such values ($J_2*L_2$) is less than the critical Blech length constant $(J*L)_{CRIT}$ corresponding to the supply line 916; and (3) the two no-flux via structures 914 and 952 within the no-flux verification test structure 952 in FIG. 14 comprised of tungsten ensure no flux of interconnect material (i.e., because of no permeability through the no-flux via structures 914 and 952) between the feeder line 902 and the test line 908, and between the test line 908 and the supply line 916.

Thus, the no-flux verification test structure 952 of FIG. 14 verifies that the test line 908 and the supply line 916 are properly designed to be individually immortal when the no-flux verification test structure 952 is determined to be immortal. The no-flux verification test structure 952 is determined to be immortal when the no-flux verification test structure 952 exhibits no electromigration failure for a sufficiently long time. Such determination of immortality of an interconnect structure is known to one of ordinary skill in the art of integrated circuit fabrication.

In this manner, the interconnect test structure 900 of FIG. 12 is used to determine the level of permeability, α, of the barrier layer material 918. The permeability of a barrier layer material within an interconnect structure results in electromigration failure of the interconnect structure, especially as the barrier material becomes thinner as integrated circuit device dimensions are further scaled down. The interconnect test structure 900 may advantageously be used for characterizing the level of such permeability for various thicknesses of the barrier layer material and for various types of the barrier layer material to design for minimized electromigration failure of interconnect structures having a barrier layer material.

The foregoing is by way of example only and is not intended to be limiting. Any specified material or any specified dimension of any structure described herein is by way of example only. For example, the present invention may advantageously be used for characterizing the level of permeability of any type of layer material, aside from the example of the diffusion barrier layer material, within an interconnect structure, as would be apparent to one of ordinary skill in the art of integrated circuit fabrication from the description herein. Furthermore, the present invention may be practiced with the feeder line 902, the test line 908, and the supply line 916 of the interconnect test structure 900 being comprised of any type of conductive material, as would be apparent to one of ordinary skill in the art of integrated circuit fabrication from the description herein.

In addition, as will be understood by those skilled in the art, the structures described herein may be made or used in the same way regardless of their position and orientation. Accordingly, it is to be understood that terms and phrases such as "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

What is claimed is:

1. An interconnect test structure for determining electromigration permeability of a layer material, comprising:

a feeder line, a test line, and a supply line, with current flowing from the supply line through the test line to the feeder line; and a no-flux structure disposed between the feeder line and the test line, and the layer material being disposed between the test line and the supply line;

wherein a respective current density and length product for each of the test line and the supply line is less than a critical Blech length constant, $(J*L)_{CRIT}$, and wherein a net current density and length product $(J*L)_{NET}$ for the test line and the supply line is greater than the $(J*L)_{CRIT}$, and wherein the electromigration permeability of the layer material is determined from an electromigration life-time of the interconnect test structure.

2. The interconnect test structure of claim 1, wherein the no-flux structure is a via comprised of a no-flux conductive material.

3. The interconnect test structure of claim 2, wherein the no-flux structure is comprised of tungsten.

4. The interconnect test structure of claim 1, wherein the layer material is a diffusion barrier layer material.

5. The interconnect test structure of claim 4, wherein the diffusion barrier layer material is disposed at a bottom of a via formed as part of a dual damascene structure of the test line.

6. The interconnect test structure of claim 4, wherein the test line and the supply line are comprised of copper.

7. A system for determining electromigration permeability of a layer material within an interconnect, comprising:

an interconnect test structure including:

a first feeder line, a first test line, and a first supply line, with current flowing from the first supply line through the first test line to the first feeder line;

a no-flux structure disposed between the first feeder line and the first test line, and the layer material being disposed between the first test line and the first supply line;

wherein a respective current density and length product for each of the first test line and the first supply line is less than a critical Blech length constant, $(J^*L)_{CRIT}$;

and wherein a net current density and length product $(J^*L)_{NET}$ for the first test line and the first supply line is greater than the $(J^*L)_{CRIT}$;

a current source for conducting the current through the interconnect test structure; and a timer operable to measure an electromigration lifetime of the interconnect test structure, wherein the electromigration permeability of the layer material is determined from the electromigration lifetime.

8. The system of claim 7, further comprising:

a processor for determining the electromigration permeability of the layer material from the measured electromigration lifetime.

9. The system of claim 7, wherein the no-flux structure is a via comprised of a no-flux conductive material.

10. The system of claim 9, wherein the no-flux structure is comprised of tungsten.

11. The system of claim 7, wherein the layer material is a diffusion barrier layer material.

12. The system of claim 11, wherein the diffusion barrier layer material is disposed at a bottom of a via formed as part of a dual damascene structure of the test line.

13. The system of claim 11, wherein the first test line and the first supply line are comprised of copper.

14. The system of claim 7, further comprising:

a no-flux verification test structure including:

a second feeder line, a second test line, and a second supply line, with the current source conducting current from the second supply line through the second test line to the second feeder line;

wherein the second test line and the second supply line each has a current density and a length substantially same as for the first test line and the first supply line, respectively;

wherein, the second test line, the second feeder line, and the second supply line are each comprised of a same conductive material as the first test line, the first feeder line, and the first supply line, respectively; and a respective no-flux structure disposed at each of, between the second feeder line and the second test line, and between the second test line and the second supply line;

wherein the timer verifies that the second test line and the second supply line are individually immortal with the current flowing therein.

15. The system of claim 14, wherein each of the respective no-flux structure is a via comprised of a no-flux conductive material.

16. The system of claim 15, wherein each of the respective no-flux structure is comprised of tungsten.

17. A method for determining electromigration permeability of a layer material within an interconnect, including the steps of:

conducting a current from a first supply line through a first test line to a first feeder line of an interconnect test structure with a no-flux structure disposed between the first feeder line and the first test line and with the layer material disposed between the first test line and the first supply line;

wherein a respective current density and length product for each of the test line and the supply line is less than a critical Blech length constant, $(J^*L)_{CRIT}$;

and wherein a net current density and length product $(J^*L)_{NET}$ for the first test line and the first supply line is greater than the $(J^*L)_{CRIT}$;

measuring an electromigration lifetime of the interconnect test structure; and determining the electromigration permeability of the layer material from the measured electromigration lifetime.

18. The method of claim 17, wherein the no-flux structure is a via comprised of a no-flux conductive material.

19. The method of claim 17, wherein the no-flux structure is comprised of tungsten.

20. The method of claim 17, wherein the layer material is a diffusion barrier layer material.

21. The method of claim 20, wherein the diffusion barrier layer material is disposed at a bottom of a via formed as part of a dual damascene structure of the first test line.

22. The method of claim 20, wherein the first test line and the first supply line are comprised of copper.

23. The method of claim 17, further including the steps of:

conducting a current from a second supply line through a second test line to a second feeder line with a respective no-flux structure disposed at each of, between the second feeder line and the second test line, and between the second test line and the second supply line;

wherein the second test line and the second supply line each has a current density and a length substantially same as for the first test line and the first supply line, respectively;

and wherein, the second test line, the second feeder line, and the second supply line are each comprised of a same conductive material as the first test line, the first feeder line, and the first supply line, respectively; and verifying that the second test line and the second supply line are individually immortal with the current flowing therein.

24. The method of claim 23, wherein each of the respective no-flux structure is a via comprised of a no-flux conductive material.

25. The method of claim 24, wherein each of the respective no-flux structure is comprised of tungsten.

* * * * *